United States Patent

Hirabayashi et al.

[11] Patent Number: 6,051,965
[45] Date of Patent: Apr. 18, 2000

[54] TWO-TERMINAL PAIRED CIRCUIT

[75] Inventors: Atsushi Hirabayashi, Tokyo; Kosuke Fujita; Kenji Komori, both of Kanagawa; Norihiro Murayama, Chiba, all of Japan

[73] Assignee: Sony Corporation, Tokyo, Japan

[21] Appl. No.: 09/170,097

[22] Filed: Oct. 13, 1998

[30] Foreign Application Priority Data

Oct. 13, 1997 [JP] Japan ................................ 9-278842

[51] Int. Cl.[7] ................ G05F 3/04; H03K 1/14; H03F 3/26
[52] U.S. Cl. ............... 323/311; 330/267; 307/264
[58] Field of Search .................... 323/311, 352, 323/364, 313; 331/115; 330/267; 307/296, 264

[56] References Cited

U.S. PATENT DOCUMENTS

| 4,066,914 | 1/1978 | Gundry | 323/352 |
| 5,486,794 | 1/1996 | Wu et al. | 331/115 |

Primary Examiner—Edward H. Tso
Assistant Examiner—Rajnikant B. Patel
Attorney, Agent, or Firm—Ronald P. Kananen; Rader, Fishman & Grauer

[57] ABSTRACT

A two-terminal paired circuit is disclosed which comprises two sets of differential pairs wherein a first set of the differential pair includes two transistors collectors of which are connected to a pair of input terminals and to a bias circuit serving also as a DC shift, bases of which are connected to the bias circuit to apply a voltage feedback from the collectors to the bases and emitters of which are connected to a constant current source and have an impedance element connected therebetween, a second set of the differential pair includes two transistors collectors of which are connected to a pair of output terminals and to a bias circuit serving also as a DC shift, bases of which are connected to the bias circuit to apply a voltage feedback from the collectors to the bases and emitters of which are connected to a constant current source and have an impedance element connected therebetween, and the voltage feedbacks together with the two sets of differential pairs are applied symmetrical with respect to left and right, whereby the impedances connected between the emitters exist in series between the input and output terminals.

7 Claims, 2 Drawing Sheets

TWO-TERMINAL PAIRED CIRCUIT

BACKGROUND OF THE INVENTION

1. Field of the Invention

The present invention relates to a two-terminal paired circuit.

2. Description of the Related Art

An example of a prior art impedance circuit is shown in FIG. 1. The circuit shown in FIG. 1 is a one-terminal paired circuit in which an impedance is formed between input terminals Vin and −Vin thereof.

In the circuit shown in FIG. 1, the collector of a transistor Q1 is connected to the input terminal Vin and its emitter is grounded through a constant current source Ie. Between the input terminal Vin and the ground, there exists a bias circuit comprised of a transistor Q5 and resistors R1, R2. The base of the transistor Q1 is connected to the connecting point between the resistors R1 and R2.

A transistor Q2 is connected at its collector to the input terminal −Vin and at its emitter to the ground through a constant current source Ie. Between the input terminal −Vin and the ground, there exists a bias circuit comprised of a transistor Q6 and resistors R1, R2. The base of the transistor Q2 is connected to a connection point between the resistors R1 and R2.

An impedance element 2Z is connected between the emitters of the transistors Q1 and Q2.

Since a current Iin, which flows through the circuit, flows from the terminal Vin to the ground as shown in FIG. 1, the impedance element 2Z is connected between the sides of input terminals Vin, −Vin and the ground.

In the impedance circuit shown in FIG. 1, an impedance component seen from the input terminal Vi seems to exist between the differential pairs. Accordingly, the impedance seen from the input side can exist for the ground only. Thus, when to a certain impedance another impedance is added, they are always connected in parallel.

Therefore, it is impossible to realize such a circuit that impedances are connected in series which is indispensable to assemble a ladder-type transmission network thereinto. Accordingly, if a high Q in filtering characteristics is realized, there is only such a measure that a filter is connected in cascade with many stages or the Q is made high while the dynamic range of the circuit is scarified. As a result, the number of circuit elements is increased with the result that the characteristics are deteriorated.

SUMMARY OF THE INVENTION

In view of the above problems, it is an object of the present invention to propose a novel two-terminal paired circuit in which an impedance can be connected in series.

According an aspect of the present invention, there is provided a two-terminal paired circuit which comprises two sets of differential pairs, wherein a first set of the differential pair includes two transistors, collectors of which are connected to a pair of input terminals and to a bias circuit serving also as a DC shift, bases of which are connected to the bias circuit to apply a voltage feedback from the collectors to the bases, and emitters of which are connected to a constant current source and have an impedance element connected therebetween, a second set of the differential pair includes two transistors collectors of which are connected to a pair of output terminals and to a bias circuit serving also as a DC shift, bases of which are connected to the bias circuit to apply a voltage feedback from the collectors to the bases, and emitters of which are connected to a constant current source and have an impedance element connected therebetween, and the voltage feedbacks together with the two sets of differential pairs are applied symmetrical with respect to left and right, whereby the impedances connected between the emitters exist in series between the input and output terminals.

According to another aspect of the present invention, there is provided an impedance variable circuit which comprises diodes connected in parallel to the bias circuit serving as the DC shift in the two-terminal paired circuit mentioned above, wherein a DC current flowing through the diodes is made variable to thereby change a feedback amount and consequently the impedance between input and output terminals is made variable.

According a further aspect of the present invention, there is provided an impedance variable circuit which comprises current variable circuits connected respectively between collectors of two transistors forming the first set of differential pair and an input terminal pair in the two-terminal paired circuit mentioned above, and between collectors of two transistors forming the second set of differential pair and an output terminal pair in the two-terminal paired circuit, wherein when the current variable circuits are controlled in DC, the impedance between the input and output terminals can be made variable.

When the two-terminal paired circuit of the present invention is used, impedances all existing in an integrated circuit (IC) can be made as a two-terminal paired circuit. In particular, if an inductance actively formed is made as a two-terminal paired circuit, a ladder-type transmission network of the inductance and the capacitance, which is impossible in the prior art, can be formed within the IC. Thus, it is possible to realize a T-type circuit using an elliptic function.

Therefore, it is possible to realize a filter having a high Q with elements the number of which is less than the prior art. At the same time, since it is of two terminals, it can be operated in a differential fashion completely, whereby the property of the circuit can be improved.

Further, the input and the output of the two-terminal paired circuit are a differential output of a differential drive, and a bias for the output can be set independently of a bias for the input, so that the dynamic range of the circuit can be made wide. Accordingly, it is appreciated that a power consumption is low and the area of an IC chip is reduced. Hence, an IC cost and its manufacturing cost may be reduced considerably.

DESCRIPTION OF THE PREFERRED EMBODIMENTS

An example of the present invention will be described with reference to the attached drawings.

Figure 1:
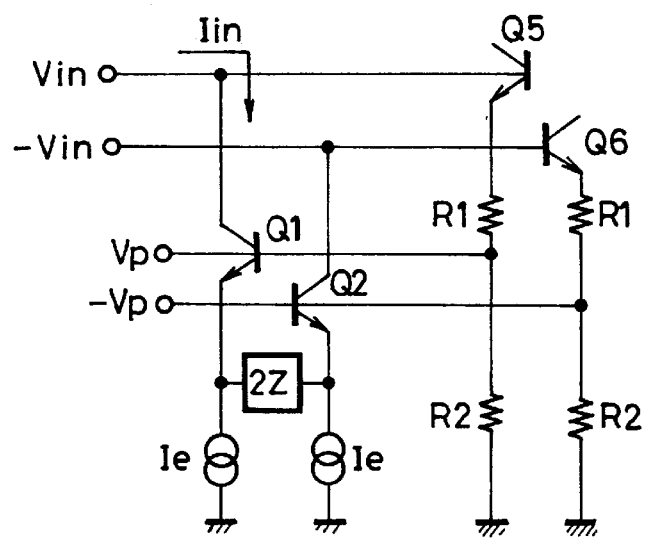
FIG. 1 is a connection diagram showing a conventional impedance circuit.
Figure 2:
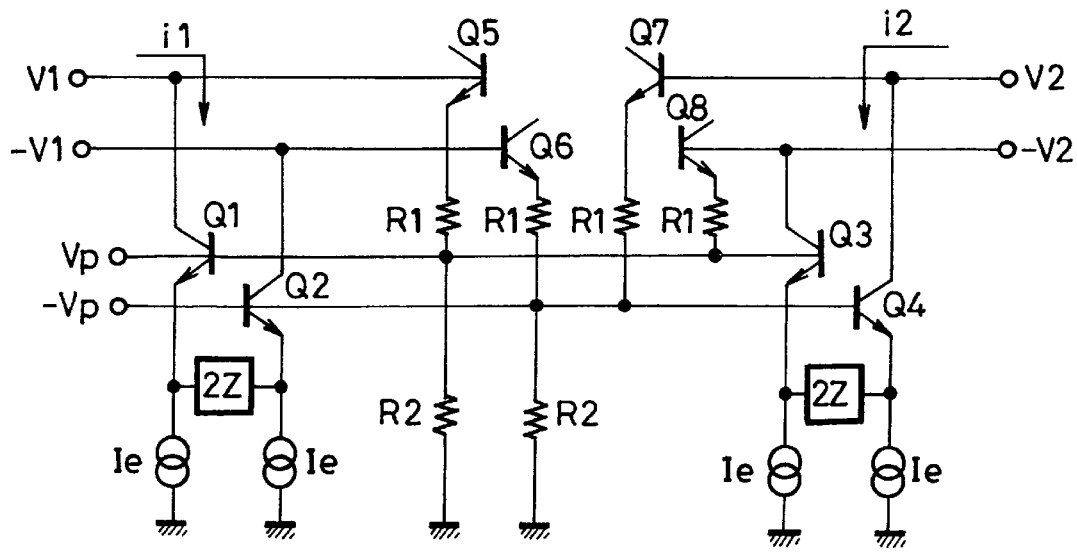
FIG. 2 is a connection diagram showing an example of the two-terminal paired circuit according to the present invention.

FIG. 2 shows an example of the two-terminal paired circuit according to the present invention.

As shown in FIG. 2, in the two-terminal paired circuit of the example, between the emitters of transistors Q1, Q2 and between the emitters of transistors Q3, Q4, which transistors Q1, Q2 and Q3, Q4 form differential pairs, respectively, impedances 2Z are connected, respectively.

The collectors of the transistors Q1, Q2 forming the differential pair are connected to the bases of transistors Q5, Q6, respectively. The connection point between the collector of transistor Q1 and the base of transistor Q5 is connected to an input terminal V1, while the connection point between the collector of transistor Q2 and the base of transistor Q6 is connected to an input terminal −V1.

Similarly, the collectors of transistors Q3, Q4 forming the differential pair are connected to the bases of transistors Q8, Q7, respectively. The connection point between the collector of transistor Q3 and the base of transistor Q8 is connected to an output terminal −V2, while the connection point between the collector of transistor Q4 and the base of transistor Q7 is connected to an output terminal V2.

The emitter of transistor Q5 is connected to the bases of transistors Q1, Q3 through a resistor R1. In the similar way, the emitter of transistor Q6 is connected through the resistor R1 to the bases of transistors Q2, Q4.

The emitter of transistor Q7 is connected to the bases of transistors Q2, Q4 through the resistor R1, and the emitter of transistor Q8 is connected through the resistor R1 to the bases of transistors Q1, Q3.

As will be apparent from the above description and also from FIG. 2, the base of transistor Q1 is directly connected to the base of transistor Q3, and a terminal led out from the connection point therebetween is shown at Vp. Similarly, the bases of transistors Q2, Q4 are connected directly, and a terminal led out from the connection point therebetween is referred to as −Vp.

According to the circuit connection shown in FIG. 2, the transistor Q5 and the transistor Q8 make the differential pair with the terminal Vp as its center point, while the transistor Q6 and the transistor Q7 make the differential pair with the terminal −Vp as its center point.

The terminals or connection points Vp and −Vp are each grounded through resistors R2, so that a voltage feedback circuit to the bases of transistors Q1, Q2, Q3 and Q4 is formed.

In the circuit shown in FIG. 2, if voltages applied to the terminals V1 and V2 are taken as V1 and V2, and a center point potential Vp ( potential at the connection point Vp) is obtained, it is expressed by the following expression;

$$V_p/R2 = \{(V1-Vp)/R1\} + \{(-V2-Vp)/R1\}$$

Accordingly, the following expression is established.

$$Vp\{(1/R2)+(2/R1)\} = (V1-V2)/R1$$

Thus, the potential Vp can be expressed by the following equation (1)

$$Vp = (V1-V2)/\{2+(R1/R2)\} \qquad (1)$$

While using the potential or voltage Vp given by the equation (1) and the impedance of the circuit shown in FIG. 2 being taken as Z, if an input current i1 flowing from the input terminal V1 to the circuit is calculated, it is expressed by the following equation (2).

$$i1 = Vp/Z = (V1-V2)/\{2+(R1/R2)\}Z \qquad (2)$$

Similarly, if a current i2 flowing through the output terminal V2 is calculated, i1=−i2 is obtained by the following equation (3).

$$i2 = -Vp/Z \qquad (3)$$
$$= (v2-V1)/\{2+(R1/R2)\}Z$$

Therefore, it may be considered that the input signal current i1 flows from the terminal V1 into the circuit and flows to the terminal V2.

Thus, an impedance Zp existing between the input terminal V1 and the output terminal V2 can be expressed by the following equation (4).

$$Zp = (V1-V2)/i1 \qquad (4)$$
$$= \{2+(R1/R2)\}Z$$

As will be apparent from the above explanation, the two-terminal paired circuit shown in FIG. 2 is such a circuit in which the impedance Zp is connected in series between the input terminals V1, −V1 and the output terminals V2, −V2.

Figure 3:
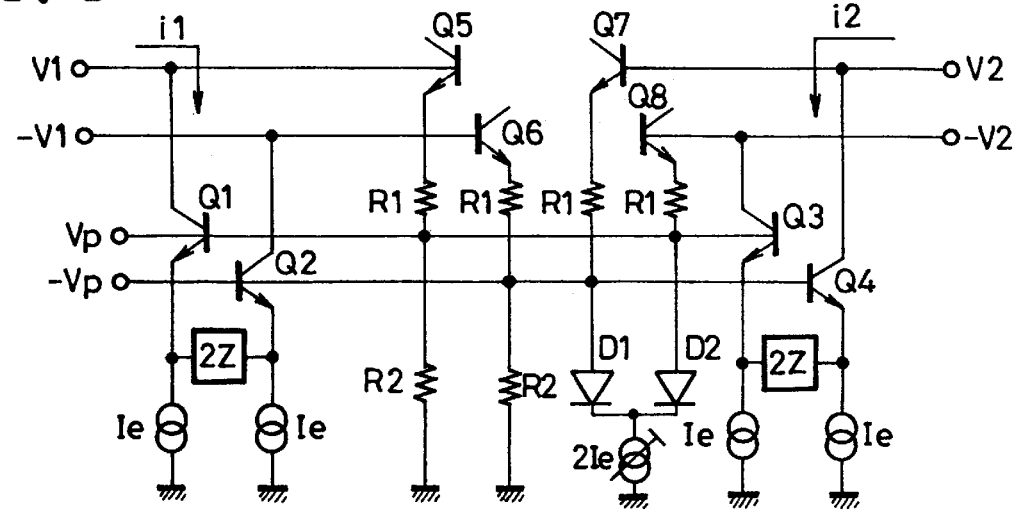
FIG. 3 is a connection diagram showing an impedance variable circuit or another example of the two-terminal paired circuit according to the present invention.

FIG. 3 shows an impedance variable circuit which is another example of the two-terminal paired circuit of the present invention.

The impedance variable circuit shown in FIG. 3 is same as that of the two-terminal paired circuit shown in FIG. 2 at almost all of its parts. The impedance variable circuit is different from the two-terminal paired circuit shown in FIG. 2 in the following point only. That is, in the circuit shown in FIG. 3, between the connection points Vp and −Vp diodes D1 and D2 are connected in opposite polarity with each other and the connection point therebetween is grounded through a variable DC current source 2Ie.

In detail, the diode D1 is connected at its anode to the connection point −Vp and at its cathode to the variable DC current source 2Ie, while the diode D2 is connected at its anode to the connection point Vp and its cathode to the variable DC current source 2Ie.

In the circuit shown in FIG. 3, if the resistance value of the diode is taken as Rd, the resistance value Rd relative to a bias current Ic flowing through the diode is expressed by the following equation (5).

$$Rd = kT/q/Ic \qquad (5)$$

where k: Boltzmann constant

T: Absolute temperature q: Charge amount of electron

Ic: Anode current

Accordingly, when Vp is obtained by the equation (1), i1 is calculated by the equation (2) while using Vp thus obtained, and then the impedance Zd between V1 and V2 are obtained by using the above values, Zd can be expressed by the following equation (6)

$$Zd = (V1 - V2)/i1 \quad (6)$$
$$= \{2 + (R1/R2) + (R1/Rd)\}Z$$
$$= \{2 + (R1/R2) + R1qIc/k/T\}Z$$

As will be clear from the equation (6), if the bias current Ic is controlled, Rd is fluctuated, and consequently the impedance Zd is fluctuated or varied.

Figure 4:
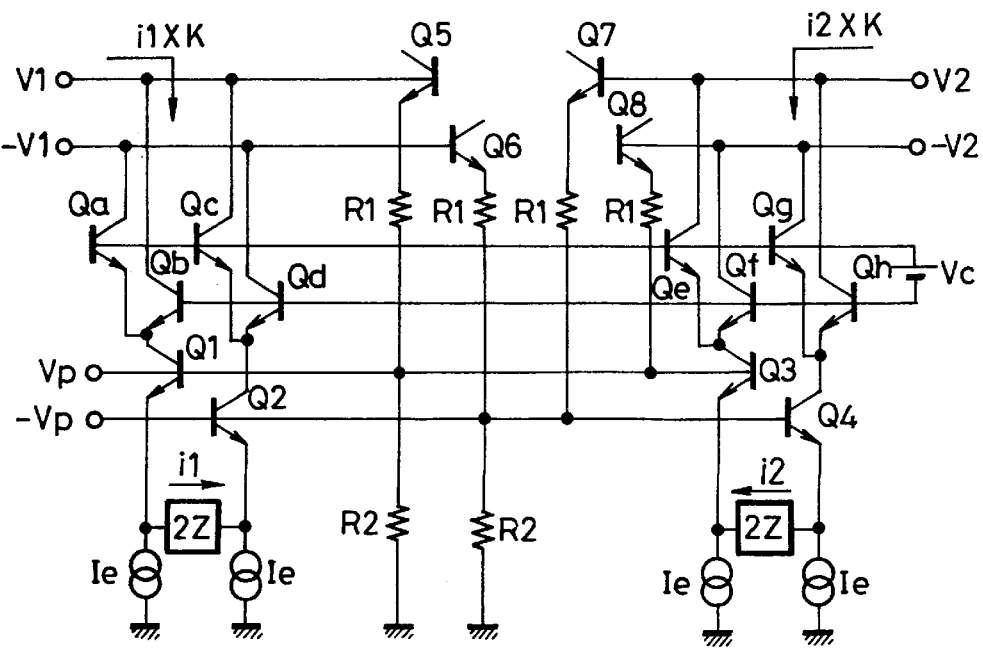
FIG. 4 is a connection diagram showing another example of the impedance variable circuit according to the present invention.

FIG. 4 shows an impedance variable circuit which is a further example of the two-terminal paired circuit according to the present invention.

This impedance variable circuit of this example is such a circuit that in the two-terminal paired circuit shown in FIG. 2, a current control circuit (hereinafter referred to as a full-balanced circuit) comprised of transistors Qa, Qb, Qc, Qd and a power source Vc is inserted into the paths from the collectors of transistors Q1, Q2, which form the differential pair, to the input terminals V1, -V1, while a full-balanced circuit comprised of transistors Qe, Qf, Qg, Qh and the power source Vc is inserted into the paths from the collectors of transistors Q3, Q4 forming the differential pair to the output terminals V2, -V2.

When the current control coefficient of the full-balanced circuit is assumed as K, the similar voltage Vp to the equation (1) is obtained, the current i1 is also calculated, and the impedance Zf between the terminals V1, V2 is obtained, it is expressed by the following equation (7)

$$Zf = (V1 - V2)/i1/K \quad (7)$$
$$= \{2 + (R1/R2)\}Z/K$$

where $-1<K<1$ is satisfied.

Since K is controlled in the range from -1 to +1, the input impedance Zf is varied up to a negative impedance as will be clear from the equation (7).

When the two-terminal paired circuit of the present invention is applied to an IC (integrated circuit), various impedances can be handled as a two-terminal network, the arrangement of a transmission line can be realized within the IC. Hence, it becomes possible to develop the present invention as a two-terminal paired circuit of a π-type, T-type or the like.

According to the two-terminal paired circuit of the present invention, all the impedances existing in the IC can be used as two-terminal paired elements, which is very important to the impedance such as a resistance and a capacity in the IC and also an active inductance.

Because the active inductance can be made as a two-terminal paired circuit, a ladder-type transmission line can be formed within an IC. A filter having a steep attenuating characteristic, which can not be presented by conventional filtering characteristic, can be realized. Further, since it is a two-terminal paired circuit, all the signals are handled as a differential signal, by which the S/N characteristic is improved.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A two-terminal paired circuit, comprising:

two sets of differential transistor pairs, wherein a first set of the differential transistor pair includes two transistors, collectors of which are respectively connected to a pair of input terminals and to a bias circuit serving also as a DC shift, bases of which are connected to said bias circuit to apply a voltage feedback from the collectors to the bases, and emitters of which are connected to a constant current course and have an impedance element connected the emitters;

a second set of the differential transistor pair includes two transistors, collectors of which are respectively connected to a pair of output terminals and to a bias circuit serving also as a DC shift, bases of which are connected to said bias circuit to apply a voltage feedback from the collectors to the bases and emitters of which are connected to a constant current source and have an impedance element connected therebetween; and wherein said voltage feedbacks together with said two sets of differential pairs are applied symmetrically with respect to left and right, whereby said impedances connected between said input and output terminals.

2. The two-terminal paired circuit as set forth in claim 1, further comprising:

an impedance variable circuit, comprising diodes connected in parallel to the bias circuit serving as the DC shift in the two-terminal paired transistor circuit, wherein a DC current flowing through said diodes is made variable to thereby change a feedback amount and consequently the impedance between the input and output terminals is made variable.

3. A two-terminal paired circuit as set forth in claim 1, further comprising:

an impedance variable circuit, comprising current variable circuits connected respectively between collectors of two transistors forming the first set of differential transistor pair and an input terminal pair in the two-terminal paired circuit, and between collectors of two transistors forming the second set of differential transistor pair and an output terminal pair in said two-terminal paired circuit, wherein when the current variable circuits are controlled in DC, whereby the impedance between the input and output terminals is variable.

4. The two-terminal paired circuit as set forth in claim 1, wherein the bases of said first pair of transistors are respectively connected to the bases of the second pair of transistors.

5. The two-terminal paired circuit as set forth in claim 4 wherein a terminal is led out from the connection point between the base of the first transistor of the first set and the base of the first transistor of the second set, and a terminal is led out from the connection point between a second transistor of said first set and a second transistor of the second set.

6. The two-terminal paired circuit as set forth in claim 2 wherein diodes are connected in opposite polarity with each other so that a connection point between said diodes is connected to a point of reference potential through a constant current source.

7. A two-terminal paired circuit, comprising:

a first differential pair of transistors respectively having their collectors respectively connected to a pair of input terminals, their emitters respectively connected to ground through a constant current source, and an impedance element connected between the emitters of the first pair of transistors;

a bias circuit comprising a first and a second bias transistor, each having its base respectively connected to said pair of input terminals and to the collectors of said first pair of transistors, and respectively having their emitters connected to a reference potential through a biasing impedance to provide a biasing potential to the bases of said first pair of transistors;

a second differential pair of transistors, each having its base connected respectively to the bases of the transistors of the first differential pair of transistors and their bases, their emitters respectively connected to a source of reference potential through a constant current source, and an impedance connected between the emitters of said second differential pair of transistors, collectors of said differential pair providing outputs from said two-terminal pair circuit respectively; and a second bias circuit having a pair of transistors having their bases respectively connected to the collectors of said second differential pair of transistors and their emitters connected to a common connection between the bases of the transistors of the first and second differential pair of transistors.

\* \* \* \* \*

UNITED STATES PATENT AND TRADEMARK OFFICE
CERTIFICATE OF CORRECTION

PATENT NO. : 6,051,965
DATED : April 18, 2000
INVENTOR(S) : HIRABAYASHI et al

It is certified that error appears in the above-identified patent and that said Letters Patent is hereby corrected as shown below:

Column 6, line 11, claim 1, line 10, after "connected" insert - -to- -.

Signed and Sealed this

Eighth Day of May, 2001

Attest:

NICHOLAS P. GODICI

*Attesting Officer*   *Acting Director of the United States Patent and Trademark Office*